Dec. 8, 1970 R. E. WILCOX, JR., ET AL 3,546,539

INTEGRATED CIRCUIT MOUNTING PANEL

Filed May 28, 1968 4 Sheets-Sheet 1

Inventors:
Russell E. Wilcox, Jr.,
John C. Sarazen,
by [signature]
Att'y.

Inventors:
Russell E. Wilcox, Jr.,
John C. Sarazen,
by James P. N. Andrews
Att'y.

Inventors:
Russell E. Wilcox, Jr.,
John C. Sarazen,
by James P. McAndrews
Att'y.

INTEGRATED CIRCUIT MOUNTING PANEL

Filed May 28, 1968 4 Sheets-Sheet 4

Inventors:
Russell E. Wilcox, Jr.,
John C. Sarazen,
by James P. M. Andrews
Att'y.

United States Patent Office
3,546,539
Patented Dec. 8, 1970

3,546,539

INTEGRATED CIRCUIT MOUNTING PANEL

Russell E. Wilcox, Jr., Norton, and John C. Sarazen, Mansfield, Mass., assignors to Texas Instruments Incorporated, Dallas, Tex., a corporation of Delaware Filed May 28, 1968, Ser. No. 732,716
Int. Cl. H05k *1/04*
U.S. Cl. 317—101 7 Claims

ABSTRACT OF THE DISCLOSURE

An integrated circuit mounting panel is shown to comprise a sheet of dielectric material having a multiplicity of rows of holes to receive the terminals of connectors, integrated circuit components and the like to be mounted on the panel. A massive electrically conductive ground plane formed on one side of the dielectric sheet surrounds the individual terminal mounting holes to provide ground shielding for component terminals inserted in the holes. A conductive power plane and an additional conductive ground plane are formed on the opposite side of the dielectric sheet, portions of these power and additional ground planes being interleaved with each other between alternate rows of the terminal mounting holes. The ground planes of the panel are electrically interconnected through the dielectric sheet. In this arrangement, connector and other component terminals inserted into the terminal mounting holes from the massive ground plane side of the panel are positioned to be conveniently connected to an interleaved portion of either the power or ground plane or to be wire-wrapped or the like, as desired, from the same side of the panel.

Conventional integrated circuit mounting panels are formed of a dielectric sheet material having conductive power and ground planes formed on respective opposite sides of the sheet material, at least the ground plane being arranged to surround the terminal mounting holes in the panel. In order to connect the terminals of circuit devices to the power plane on these prior art mounting panels, the terminals to be connected to the power plane had to be selected before the connectors or other circuit components were mounted on the panel. The mounting holes to receive these selected terminals were then plated and connected to the power plane so that, when the connectors or other circuit components were subsequently plugged into the mounting panel from the power plane side of the panel, the appropriate terminals could be electrically connected to the power plane by means of the platings in the selected mounting holes. In this arrangement, manufacture of the mounting panel was not normally initiated until design of the circuit to be mounted on the panel had been substantially completed and until the number and location of connections to be made to the power plane had been determined. That is, the mounting panel would not be ordinarily ordered from the panel manufacturers until after the integrated circuit design had been completed, a factor which extended the period of time between initiation of a circuit design and final development of an integrated circuit to meet a particular need. Further, if any changes were to be made in an integrated circuit design after connectors and other circuit devices had been mounted in a prior art mounting panel, the circuit devices usually had to be removed from the panel to permit changes in the power connections of the circuit.

It is an object of this invention to provide a novel and improved integrated circuit mounting panel; to provide such a panel which can be used for mounting any one of a variety of integrated circuit designs; to provide such a panel which can be manufactured as a standard item for use in mounting a variety of subsequently developed integrated circuit designs; to provide such a panel on which connectors, integrated circuit components and other electrical components can be readily mounted so that any selected terminals of the electrical devices can be conveniently connected to the power or ground plane of the panel or can be wire-wrapped or otherwise electrically connected from the same side of the panel; and to provide such a panel which is of simple and inexpensive construction.

Other objects, advantages and details of the integrated circuit mounting panel of this invention appear in the following detailed description of a preferred embodiment of this invention, the description referring to the drawings in which.

Figure 1:
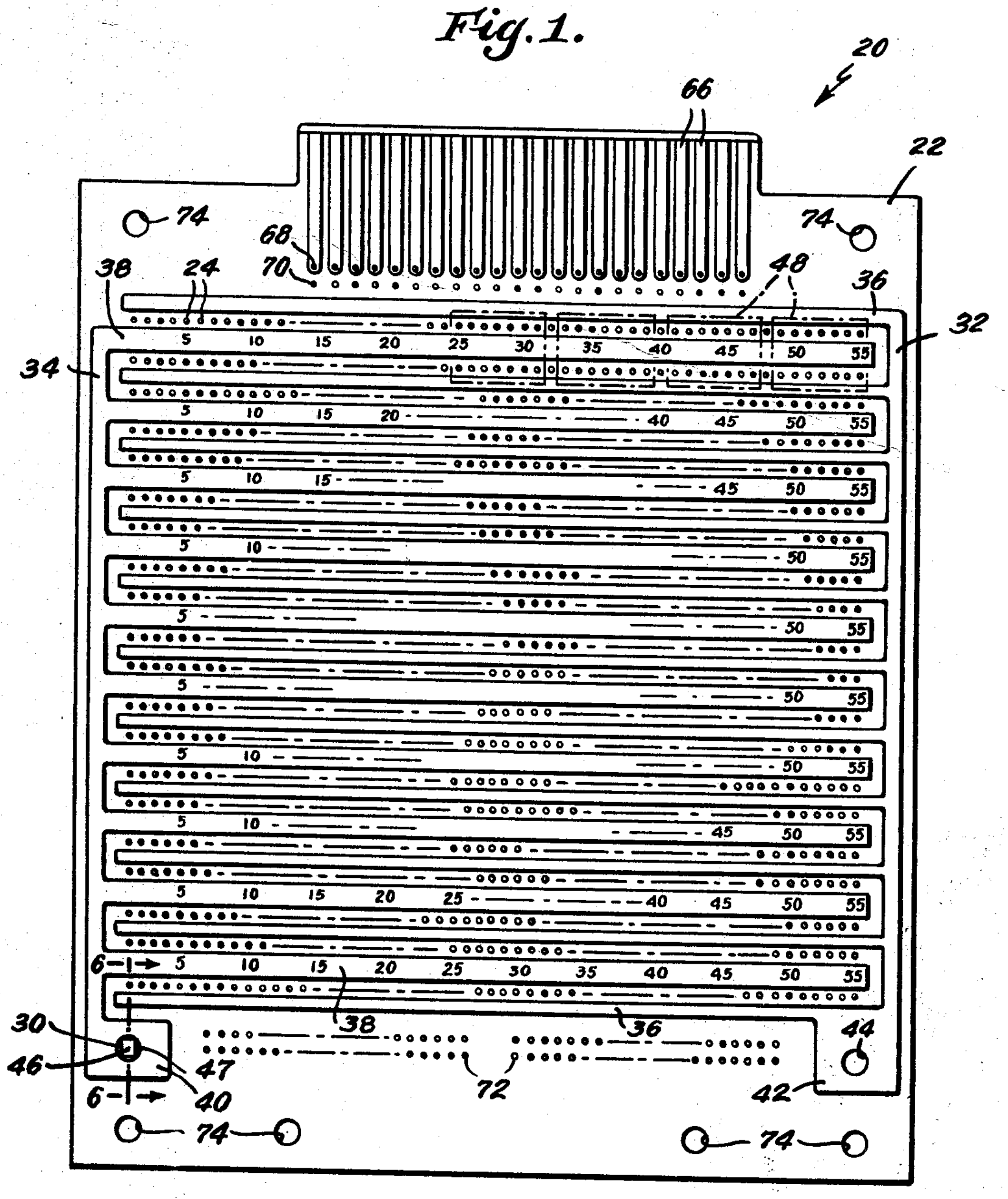
FIG. 1 is a top elevation view of the integrated circuit mounting panel of this invention.

Referring to the drawings, 20 in FIGS. 1–6 indicates the novel and improved integrated circuit mounting panel of this invention which is shown to include a sheet or layer 22 of dielectric material preferably formed of epoxy-filled fiberglass or other relatively stiff dielectric material such as is conventionally used in the manufacture of printed circuit boards. This dielectric sheet is provided with a multiplicity of terminal mounting holes 24 which are arranged in a series of rows with proper spacing between the holes and between rows of holes to receive terminals from connectors, integrated circuit components or other electrical components to be mounted on the panel. For example, in a practical mounting panel arrangement, twenty rows of the mounting holes are provided with 0.300" between centers of the rows and with forty-seven holes on 0.100" spacings in each of the rows.

Figure 2:
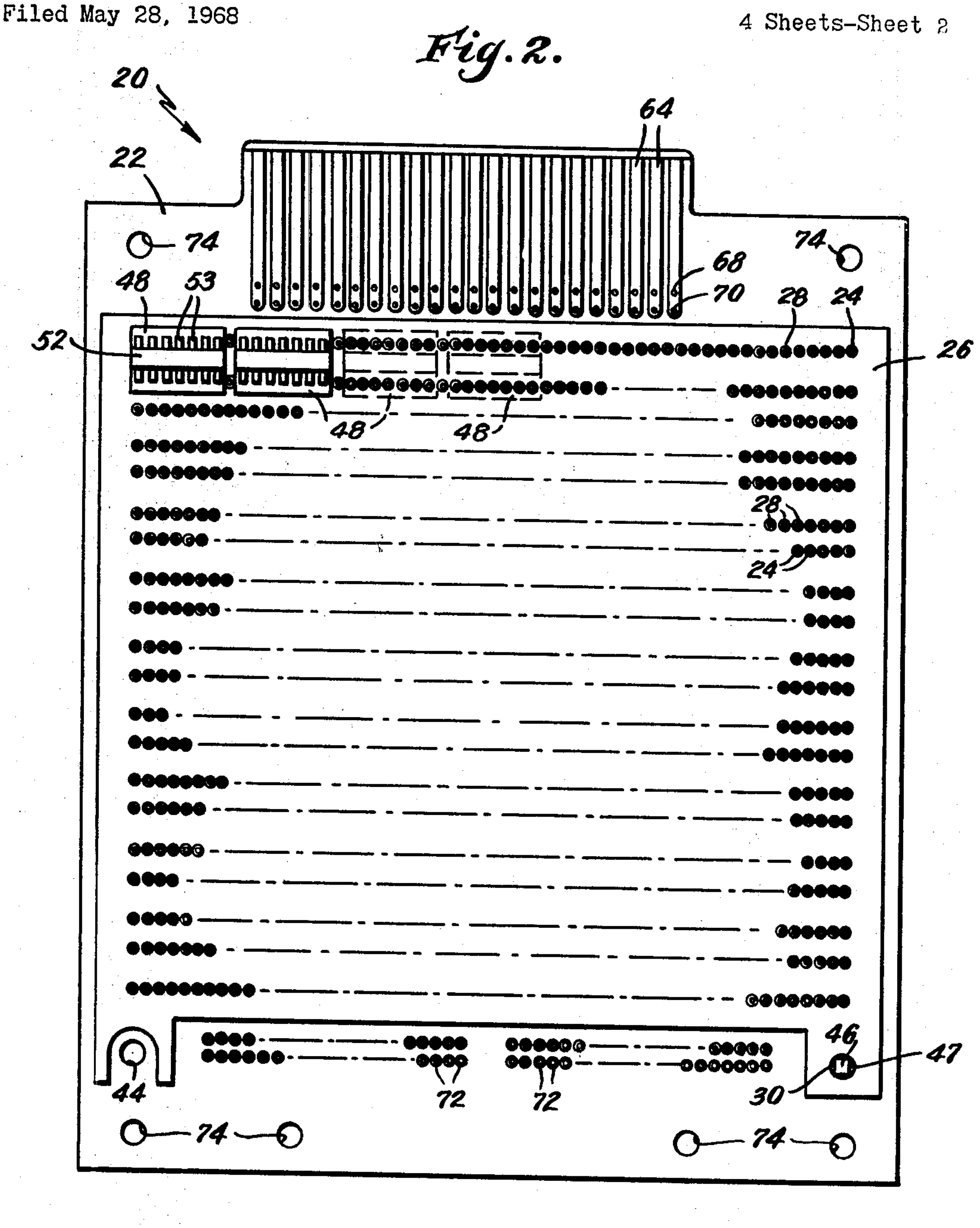
FIG. 2 is a bottom elevation view of the panel illustrated in FIG. 1.

In accordance with this invention, a massive ground plane 26 is formed on one side of the dielectric sheet 22, this ground plane preferably comprising a layer of solder-plated copper of about 0.002" thickness deposited in the dielectric sheet and being etched to the configuration illustrated. This ground plane is deposited and etched in any of the conventional methods customarily used in forming printed circuit panels. As shown, this massive ground plane is etched at 28 (see FIG. 5) to closely surround each of the terminal mounting holes 24 individually so that each terminal mounting hole is provided with the maximum possible ground shielding. As no electrical connections are to be made between terminals in the mounting holes and the ground plane 26 at the massive ground plane side of the panel 20, the ground plane 26 can be etched very close to each of the mounting holes without requiring excessive spacing between the ground plane and mounting holes to prevent solder connections between selected terminals and the ground plane as was required in prior art integrated circuit mounting panels. The ground plane 26 is also preferably etched around an additional aperture 30 formed at one corner of the ground plane as illustrated in FIG. 2.

Figure 6:
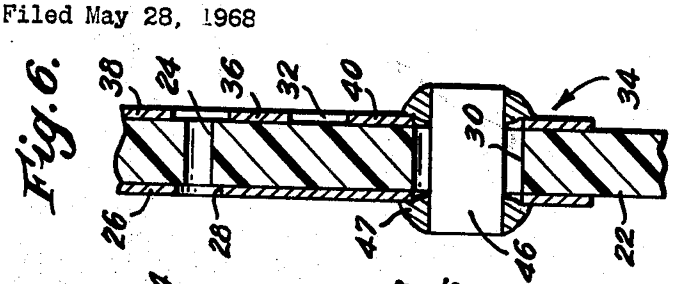
FIG. 6 is a section view along line 6—6 of FIG. 1.
Figure 5:
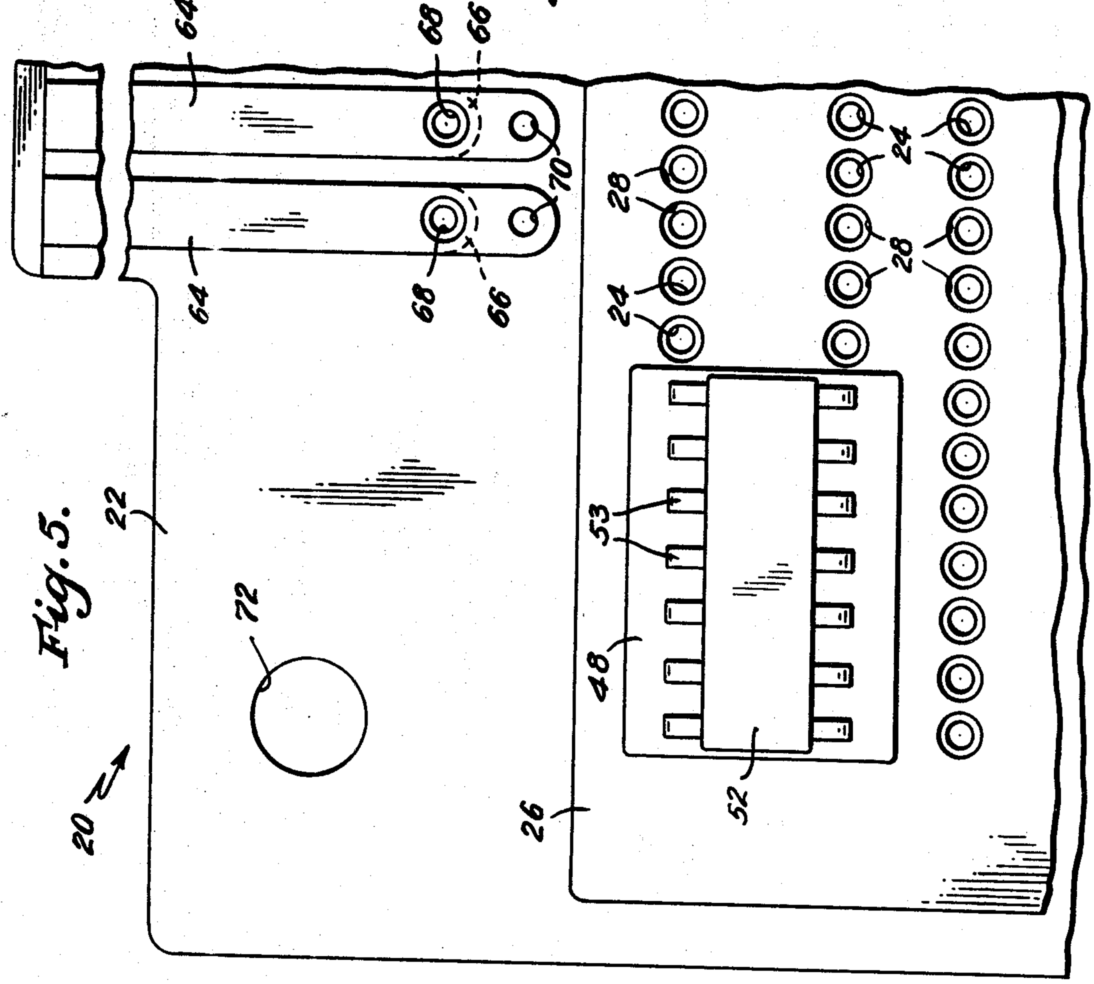
FIG. 5 is another partial view similar to FIG. 2 to greatly enlarged scale.

In accordance with this invention, a power plane 32 and an additional ground plane 34 are formed on the opposite side of the dielectric sheet 22 from the massive ground plane 26, the power plane having portions 36 and the additional ground plane having portions 38 which are interleaved with each other between alternate rows of the terminal mounting holes 24 as shown in FIG. 1. The additional ground plane and the power plane each preferably comprise a 0.002" thick layer of solder-plated copper which is deposited upon the dielectric sheet and etched to the configuration shown in conventional manner. As illustrated, the additional ground plane 34 has a portion 40 formed around the aperture 30 in the dielectric sheet, while the power plane 32 has a portion 42 formed around another aperture 44 in the dielectric sheet. A pin 46 or other connector means is inserted in the aperture 30 and is soldered as at 47 or otherwise electrically connected to the ground planes 26 and 34 for electrically connecting the ground planes to each other as shown in FIG. 6. An additional pin or connector means (not shown) can be inserted in the aperture 44 and can be soldered or otherwise connected to the power plane and to a power source for connecting the power plane to the power source as will be understood.

Figure 3:
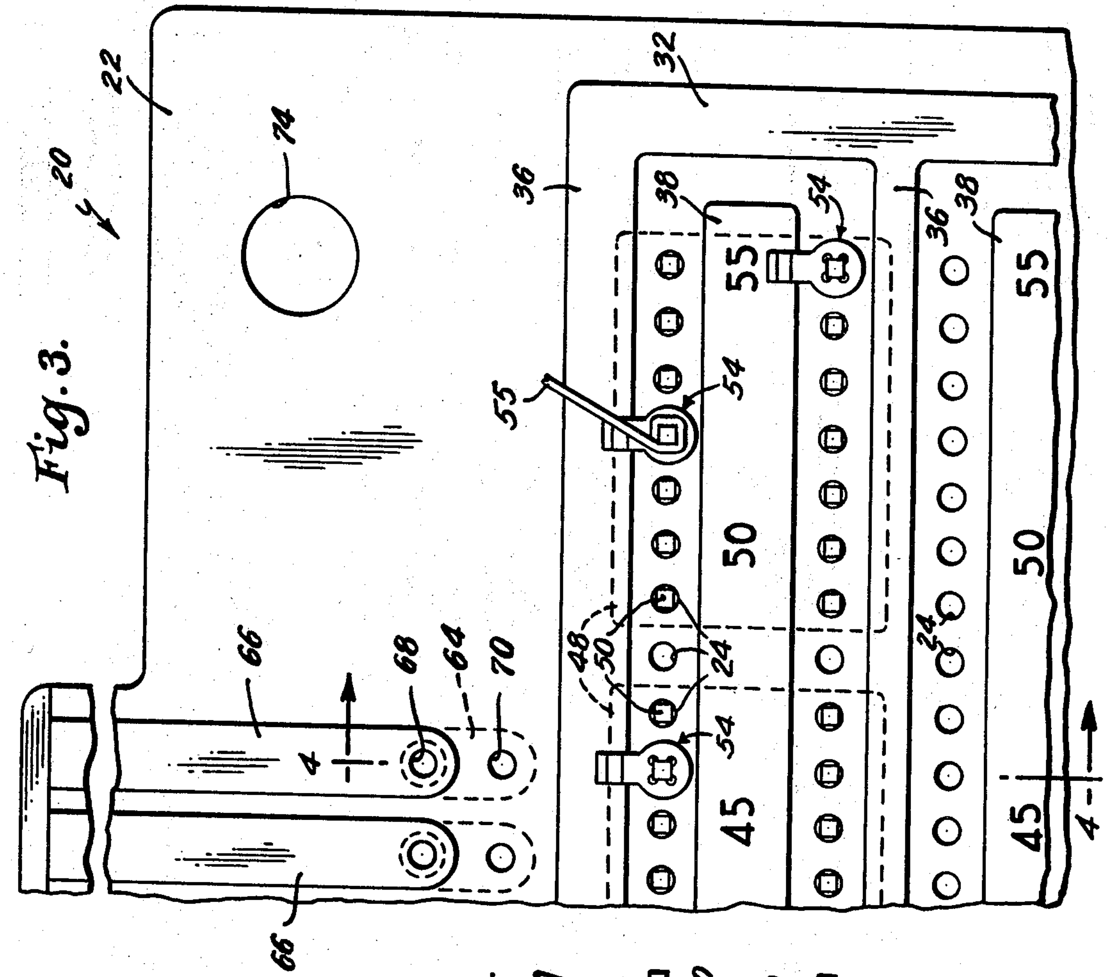
FIG. 3 is a partial view similar to FIG. 1 to greatly enlarged scale.
Figure 4:
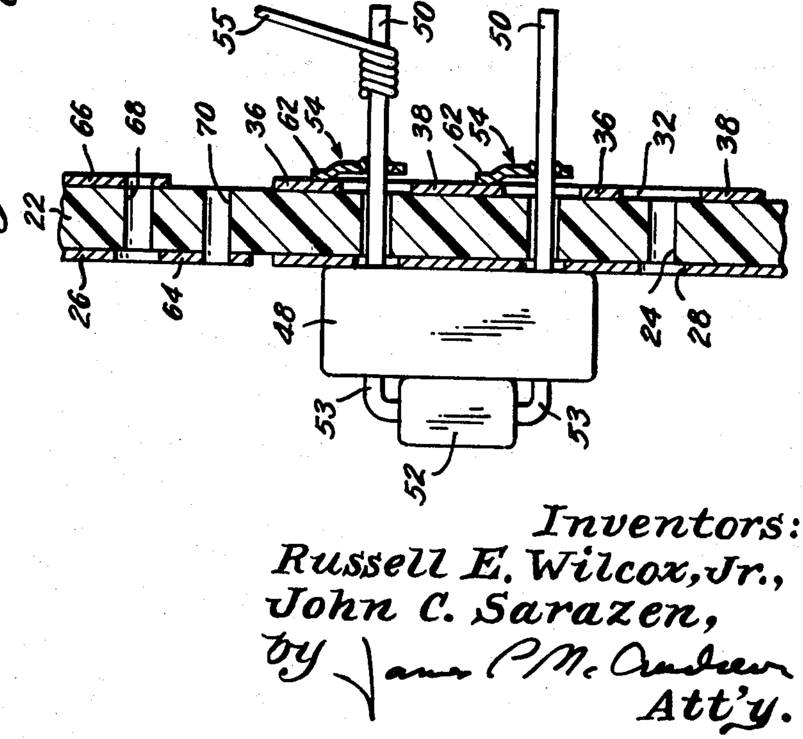
FIG. 4 is a section view along line 4—4 of FIG. 3.

In the integrated circuit mounting panel construction as shown, multiterminal connectors, integrated circuit components and other electrical components are readily mounted on the panel 20 by inserting the terminals of the connectors or other devices in the terminal mounting holes 24 of the panel from the massive ground plane side of the panel. For example, a plurality of connectors 48 (only four of which are indicated in FIGS. 1 and 2) are easily plugged into the mounting panel by inserting the connector terminals 50 into terminal mounting holes 24 as is best illustrated in FIGS. 3 and 4. As will be understood, the terminal mounting holes 24 are preferably proportioned to receive terminals of a standard size and configuration and are preferably proportioned to lightly grip the terminals for at least temporarily holding the terminals in the holes. Where connectors are used, the terminals 53 of an integrated circuit or other electrical components 52 are then readily plugged into the connectors as shown in FIGS. 1–4. This arrangement positions the connector or other device terminals to be conveniently connected to either the power plane 32 or to the additional ground plane 34 or to permit wire-wrapping, as indicated at 55, or other electrical connection to the terminals, as desired, from the same side of the panel 20. Interleaved portions 36 and 38 of the power and additional ground planes are conveniently located adjacent to the terminal mounting holes 24 for facilitating this electrical connection to the power or additional ground planes, as shown.

Figure 7:
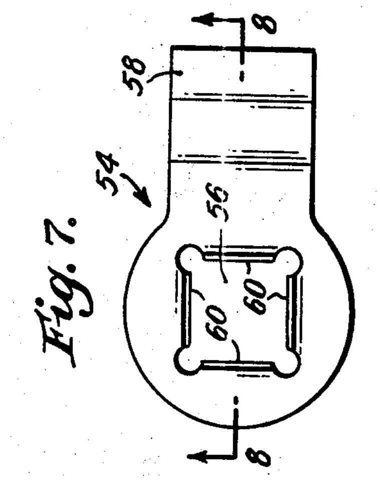
FIG. 7 is a plan view of the clip illustrated in FIG. 4 drawn to greatly enlarged scale.
Figure 8:
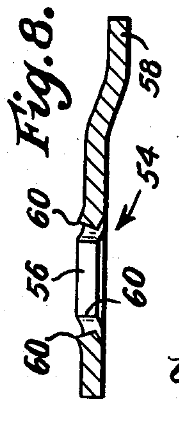
FIG. 8 is a section view along line 8—8 of FIG. 7.

For example, jumper clips 54, as illustrated in FIGS. 7 and 8 in particular, are each provided with an appropriately shaped aperture 56 to fit snugly around the connector or other terminals 50 and are each provided with a tongue portion 58 to be soldered or otherwise electrically connected to either the power plane or additional ground plane of the panel 20. Preferably the clip apertures 56 are formed with projections 60 which are located around the aperture 56 and are slightly bent out of the plane of the clip so that after the clips have been conveniently fitted over a connector terminal 50 or the like, the projections engage the terminal to prevent rotation of the clip on the terminal and to restrict removal of the clip from the terminal. The clips are easily soldered to either the power plane portion 36 or the ground plane portion 38 as indicated at 62 in FIG. 3.

The mounting panel 20 above described is utilized to greatly facilitate the design, development and modification of integrated circuits. This is, the mounting panel is manufactured in the configuration shown and is then stored to be ready for use in mounting an integrated circuit. When an integrated circuit design is initiated, the appropriate number of connectors 48 or other components are readily plugged into the panel 20 from the massive ground plane side of the board. When the integrated circuit design is subsequently completed, proper clips are readily fitted over selected connector terminals and are soldered to either the power or ground planes as indicated by the circuit design to complete the power and ground plane connectors of the circuit. The panel with its mounted connectors and the like is then ready for wire-wrapping or other connections to the appropriate connector terminals as desired. As these ground and power plane connections are easily made, completion of the power and ground connections are made immediately after completion of the circuit design and no delay is imposed by any agreement to design and manufacture a custom mounting panel for each new circuit design. Further, if changes are made on the power or ground connections of a circuit design after connectors or the like have been mounted on the panel 20, removal and relocation of the appropriate jumper clips 56 are easily accomplished from the terminal or pin side of the mounting panel without requiring the removal of any connectors or the like from the panel.

Although not required in the mounting panel 20 of this invention, edge connector strips 64 and 66 can be located on respective sides of the dielectric sheet 22 and can be formed around apertures 68 and 70 in the dielectric sheet in conventional manner, the strips 64 being etched around the apertures 68 as shown. Additional apertures 72 can also be formed in the panel, the apertures 68, 70 and 72 being used in any conventional manner for mounting additional terminals or other connecting means as required in a circuit design. The panel is also provided with additional apertures 74 for use in mounting handle means or the like or for use in mounting the panel in a housing as required.

It should be understood that although a particular embodiment of the integrated circuit mounting panel of this invention has been described by way of illustration, this invention includes all modifications and equivalents thereof which fall within the scope of the appended claims.

We claim:

1. A mounting panel for integrated circuits and the like comprising a layer of dielectric material having a plurality of apertures therein arranged in a plurality of rows for receiving terminals, a first electrically conductive metal layer connectable to a power source disposed on one side of said dielectric layer and having portions thereof extending along each row of said apertures for disposing a portion of said first metal layer in substantially equal spaced relation to each of said apertures, and a second electrically conductive metal layer connectable to electrical ground disposed on said one side of said dielectric layer and having portions thereof extending along each row of said apertures for disposing a portion of said second metal layer in said substantially equally spaced relation to each of said apertures.

2. A mounting panel for integrated circuits and the like comprising a layer of dielectric material having a plurality of apertures therein arranged in a plurality of parallel rows for receiving terminals, a first electrically conductive metal layer disposed on one side of said dielectric layer, said first metal layer having a plurality of relatively larger apertures therein aligned with respective dielectric layer apertures so that said first metal layer is disposed in spaced, surrounding relation to said dielectric layer apertures, a second electrically conductive metal layer connectable to a power source disposed on an opposite side of said dielectric layer and having portions extending between alternate rows of said dielectric layer apertures for disposing portions of said second metal layer in substantially equally spaced relation to each of said dielectric layer apertures, and a third electrically conductive metal layer connectable to said first metal layer and to electrical ground disposed on said opposite side of said dielectric layer and having portions extending between the other alternate rows of said dielectric layer apertures for disposing portions of said third metal layer in said substantially equally spaced relation to each of said dielectric layer apertures.

3. A mounting panel as set forth in claim 2 having an additional aperture extending through said first and third metal layers and said layer of dielectric material and having conductive means extending through said additional aperture for electrically connecting said first and third metal layers to each other.

4. A mounting panel for integrated circuits and the like comprising a sheet of dielectric material having a multiplicity of apertures arranged in a plurality of parallel rows extending across said sheet for receiving terminals therein, a first electrically conductive metallic layer disposed on one of the sheet surfaces of said sheet, said first metal layer having a plurality of relatively larger apertures aligned with respective dielectric layer apertures so that said first metal layer is disposed in spaced surrounding relation to each of said individual dielectric layer apertures, a second electrically conductive metallic layer connectable to a power source having one portion disposed on the opposite sheet surface of said sheet extending along the ends of said rows of apertures at one end thereof, and a third electrically conductive metallic layer connectable to said first metal layer and to electrical ground having one portion disposed on said opposite sheet surface extending along the ends of said rows of apertures at the opposite end thereof, said second and third metal layers having additional portions thereof extending from said one portion thereof between alternate rows of said dielectric layer apertures to be in interleaved relation with each other and to dispose portions of said second and third metal layers in substantially equally spaced relation to each of said dielectric layer apertures.

5. A mounting panel system comprising a layer of dielectric material having a plurality of apertures therein arranged in a plurality of rows; a first electrically conductive metal layer connectable to a power source disposed on one side of said dielectric layer and having portions extending between alternate rows of said apertures for disposing portions of said first metal layer in substantially equally spaced relation to each of said apertures, a second electrically conductive metal layer connectable to electrical ground disposed on said one side of said dielectric layer and having portions extending between the other alternate rows of said apertures for disposing portions of said second metal layer in said substantially equally spaced relation to each of said apertures, and at least one electrical device having terminal means extending through said apertures from the opposite side of said dielectric layer, selected terminals being connected to said first and second metal layers respectively.

6. A mounting panel system comprising a sheet of dielectric material having a multiplicity of apertures arranged in a plurality of parallel rows extending across said sheet for receiving terminals therein, a first electrically conductive metallic layer disposed on one of the sheet surfaces of said sheet, said first metal layer having a plurality of relatively larger apertures aligned with respective dielectric layer apertures so that said first metal layer is disposed in spaced surrounding relation to each of said individual dielectric layer apertures, a second electrically conductive metallic layer connectable to a power source having one portion disposed on the opposite sheet surface of said sheet extending along the ends of said rows of apertures at one end thereof, a third electrically conductive metallic layer connectable to said first metal layer and to electrical ground having one portion disposed on said opposite sheet surface extending along the ends of said rows of apertures at the opposite end thereof, said second and third metal layers having additional portions thereof extending from said one portion thereof between alternate rows of said dielectric layer apertures to be in interleaved relation with each other and to dispose portions of said second and third metal layers in substantially equally spaced relation to each of said dielectric layer apertures, and a plurality of multi-terminal electrical devices each having a plurality of terminals extending through selected apertures from said one sheet surface, at least selected device terminals being selectively connected to said second and third metal layers respectively.

7. A mounting panel system as set forth in claim 6 wherein jumper clip means are engaged with said selected device terminals selectively connecting said terminals to one of said second and third metal layers respectively.

References Cited

UNITED STATES PATENTS

| | | | |
|---|---|---|---|
| 2,965,812 | 12/1960 | Bedford ---- | 317—101CC(UX) |
| 3,081,416 | 3/1963 | Tuttle et al. ------ | 174—68.5X |
| 3,093,805 | 6/1963 | Osifchin ----- | 317—101B(UX) |
| 3,147,404 | 9/1964 | Sinner ----- | 317—101DH(UX) |
| 3,179,913 | 4/1965 | Mittler et al. | 317—101CM(UX) |
| 3,325,766 | 6/1967 | Kolb et al. -- | 317—101CC(UX) |

ROBERT K. SCHAEFER, Primary Examiner

D. SMITH, Jr., Assistant Examiner

U.S. Cl. X.R.

174—68.5; 339—17